United States Patent
Damiano, Jr. et al.

(10) Patent No.: US 8,872,128 B2
(45) Date of Patent: Oct. 28, 2014

(54) SAMPLE HOLDER PROVIDING INTERFACE TO SEMICONDUCTOR DEVICE WITH HIGH DENSITY CONNECTIONS

(71) Applicant: Protochips, Inc., Raleigh, NC (US)

(72) Inventors: John Damiano, Jr., Apex, NC (US); Stephen E. Mick, Apex, NC (US); David P. Nackashi, Raleigh, NC (US); Montie Roland, Apex, NC (US); Paul Hakenewerth, Raleigh, NC (US)

(73) Assignee: Protochips, Inc., Raleigh, NC (US)

( * ) Notice: Subject to any disclaimer, the term of this patent is extended or adjusted under 35 U.S.C. 154(b) by 0 days.

(21) Appl. No.: 13/920,419

(22) Filed: Jun. 18, 2013

(65) Prior Publication Data

US 2013/0277572 A1   Oct. 24, 2013

Related U.S. Application Data

(63) Continuation of application No. 13/085,273, filed on Apr. 12, 2011, now Pat. No. 8,466,432.

(60) Provisional application No. 61/323,107, filed on Apr. 12, 2010.

(51) Int. Cl.
    *H01J 37/26* (2006.01)
    *H01J 37/20* (2006.01)

(52) U.S. Cl.
    CPC .............. *H01J 37/20* (2013.01); *H01J 37/26* (2013.01); *H01J 2237/2007* (2013.01); *H01J 2237/2008* (2013.01)

USPC ............. 250/441.11; 250/440.11; 250/442.11

(58) Field of Classification Search
    USPC ......................... 250/440.11, 441.11, 442.11
    See application file for complete search history.

(56) References Cited

U.S. PATENT DOCUMENTS

| | | | | |
|---|---|---|---|---|
| 5,089,708 | A * | 2/1992 | Asselbergs | 250/442.11 |
| 7,476,872 | B2 * | 1/2009 | Terada et al. | 250/442.11 |
| 8,071,942 | B2 * | 12/2011 | Watson et al. | 250/305 |
| 8,134,131 | B2 * | 3/2012 | Terada et al. | 250/442.11 |
| 8,466,432 | B2 * | 6/2013 | Damiano et al. | 250/441.11 |
| 2010/0140497 | A1 * | 6/2010 | Damiano et al. | 250/440.11 |
| 2010/0320396 | A1 * | 12/2010 | Terada et al. | 250/441.11 |
| 2011/0032611 | A1 * | 2/2011 | Mick et al. | 359/395 |
| 2011/0127427 | A1 * | 6/2011 | Nackashi et al. | 250/307 |
| 2011/0248165 | A1 * | 10/2011 | Damiano et al. | 250/307 |

FOREIGN PATENT DOCUMENTS

| | | |
|---|---|---|
| WO | 2008061224 A1 | 5/2008 |
| WO | 2008109406 A1 | 9/2008 |
| WO | 2008141147 A1 | 11/2008 |
| WO | 2009086319 A2 | 7/2009 |
| WO | 2009117412 A1 | 9/2009 |
| WO | 2011038062 A2 | 3/2011 |

* cited by examiner

*Primary Examiner* — David A Vanore
(74) *Attorney, Agent, or Firm* — Tristan A. Fuierer; Moore & Van Allen, PLLC

(57) ABSTRACT

A novel specimen holder for specimen support specimen support devices for insertion in electron microscopes is provided. The novel specimen holder of the invention provides mechanical support for specimen support devices and as well as electrical contacts to the specimens or specimen support devices.

16 Claims, 2 Drawing Sheets

SAMPLE HOLDER PROVIDING INTERFACE TO SEMICONDUCTOR DEVICE WITH HIGH DENSITY CONNECTIONS

CROSS-REFERENCE TO RELATED APPLICATIONS

This application is filed under the provisions of 35 U.S.C. §111(a) and claims the priority of U.S. patent application Ser. No. 13/085,273 filed on Apr. 12, 2011 and U.S. Provisional Patent Application No. 61/323,107 filed on 12 Apr. 2010, both of which are hereby incorporated by reference herein in their entirety.

FIELD

The invention relates generally to specimen holders used for mounting samples in an electron microscope, e.g., a transmission electron microscope (TEM), a scanning transmission electron microscopy (STEM) and variations of the scanning electron microscopes (SEM) that use traditional TEM-type holders and stages, for imaging and analysis.

BACKGROUND

The specimen holder is a component of an electron microscope providing the physical support for specimens under observation. Specimen holders traditionally used for TEMs and STEMs, as well as some modern SEMs, consist of a rod that is comprised of three key regions: the end (300), the barrel (200) and the specimen tip (100) (see, e.g., FIG. 1). In addition to supporting the specimen, the specimen holder provides an interface between the inside of the instrument (i.e., a vacuum environment) and the outside world.

To use the specimen holder, one or more samples are first placed on a specimen support device. The specimen support device is then mechanically fixed in place at the specimen tip, and the specimen holder is inserted into the electron microscope through a load-lock. During insertion, the specimen holder is pushed into the electron microscope until it stops, which results in the specimen tip of the specimen holder being located in the column of the microscope. At this point, the barrel of the specimen holder bridges the space between the inside of the microscope and the outside of the load lock, and the end of the specimen holder is outside the microscope. To maintain an ultra-high vacuum environment inside the electron microscope, flexible o-rings are typically found along the barrel of the specimen holder, and these o-rings seal against the microscope when the specimen holder is inserted. The exact shape and size of the specimen holder varies with the type and manufacturer of the electron microscope, but each holder contains these three key regions.

The specimen holder can also be used to provide stimulus to the specimen, and this stimulus can include temperature, electrical current, electrical voltage, mechanical strain, etc. One type of specimen holder is a semiconductor device. The semiconductor device can be designed to have an array of electrical contact pads on it, and the sample holder can be designed to transfer electrical signals from an external source, through the holder, to the semiconductor device. Existing devices use delicate wires or clips to create the contact between the holder and the device. Further, said devices provide lower density (i.e., less) electrical contacts to the devices, which is disadvantageous when the user wants to perform multiple experiments all on the same device.

The need for high density arrays comes from an increasing demand to perform a wider variety of experiments on a sample within the microscope—a field known as in situ microscopy. As demonstrated in previous filings by the present inventors, semiconductor specimen support devices can be made to interact with the sample by passing current or creating fields across or near a sample. These electrical signals can be used to heat, cool, bias or charge a sample, all while being viewed in real time within the microscope. It is an object of the present invention to increase the number of electrical contacts provided to a sample, thus increasing the number of or type of experiments that can be done on the same device.

SUMMARY

The present invention relates generally to a novel specimen holder which provides mechanical support for specimen support devices and as well as electrical contacts to the specimens or specimen support devices. Specifically, a unique apparatus and method for electrically contacting a specimen support device using a small printed circuit board and elastomeric pad for conduction are described.

In one aspect, an electron microscope specimen holder is described, said specimen holder comprising a tip body and a clipping means.

In another aspect, a method of using a specimen holder in electron microscopy is described, said method comprising:
positioning a specimen support device in a specimen holder, wherein said specimen holder comprises a tip body and a clipping means; and
inserting said specimen holder in an electron microscope.

In still another aspect, a method of providing an electrical contact between a specimen and a specimen holder of an electron microscope is described, said method comprising:
positioning a specimen on a specimen support device, wherein the specimen support device comprises a frame, at least one electrical lead and at least one membrane region; and
inserting the specimen support device in the specimen holder, wherein the specimen holder comprises a tip body and a clipping means, wherein the clipping means comprise at least one electrical contact integrated on and/or in a bottom surface of the clipping means; and wherein at least one electrical lead of the device substantially contacts at least one electrical contact of the clipping means.

Other aspects, features and embodiments of the invention will be more fully apparent from the ensuing disclosure and appended claims.

DETAILED DESCRIPTION

Figure 1:
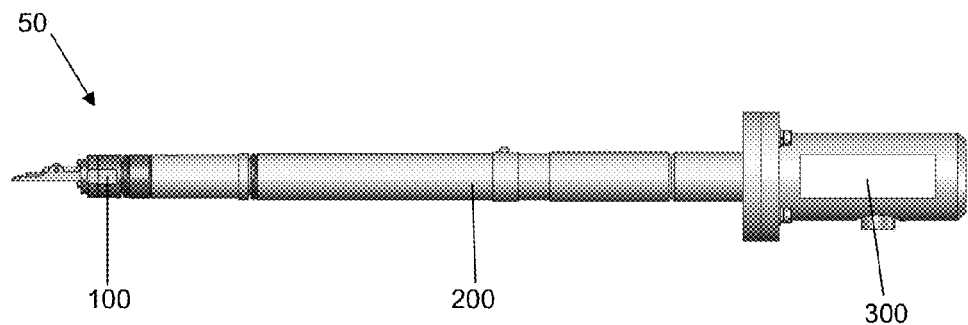
FIG. 1 shows a schematic of a generic specimen holder (50). The specimen holder is comprised of three regions: the tip (100), the barrel (200), and the end (300).

The present invention generally relates to novel specimen holders, methods for interfacing samples at the tip of the specimen holder, and uses of the novel specimen holder. It is to be understood that the specimen holder and specimen holder interface described herein are compatible with and may be interfaced with the specimen support devices, e.g., semiconductor specimen support devices, disclosed in International Patent Application Nos. PCT/US08/63200 filed on May 9, 2008 and PCT/US08/88052 filed on Dec. 22, 2008, which are both incorporated herein by reference in their entireties. It should also be appreciated by one skilled in the art that alternative specimen support devices may be interfaced with the specimen holder described herein. The specimen holder provides mechanical support for one or more specimens or specimen support devices and may also provide electrical contacts to the specimens or specimen support devices. The specimen holder can be manufactured with tips, barrels and ends of various shapes and sizes such that the specimen holder fits any manufacturer's electron microscope.

As used herein, a "specimen support device" corresponds to a structure that holds a specimen for microscopic imaging. A specimen support device can provide electrical contacts and/or an experimental region. Devices may include one, more than one or even an array of experimental regions and may include integrated features such as electrodes, thermocouples, and/or calibration sites, as readily determined by one skilled in the art. One preferred embodiment includes specimen support devices made with MEMS technology and with thin membranes (continuous or perforated) for supporting a specimen in the experimental region. The specimen support devices can provide electrical contacts or electrodes for connection to electrical leads. The specimen support devices can also contain features to route electrical signals to the experimental region(s). The electrical signals on the specimen support devices may be routed on the specimen support device in any configuration including but not limited to pairs of signals routed to an experimental region or a row/column addressing scheme to access a greater number of experimental regions than the number of available signal leads. In a preferred embodiment, the specimen support device comprises a membrane comprising at least one membrane region and at least one conductive element in contact with the membrane forming a heatable region of the membrane.

As defined herein, a "membrane region" on the specimen support device corresponds to unsupported material comprising, consisting of, or consisting essentially of carbon, silicon nitride, SiC or other thin films generally 1 micron or less having a low tensile stress (<500 MPa), and providing a region at least partially electron transparent region for supporting the at least one specimen. The membrane region may include holes or be hole-free. The membrane region may be comprised of a single material or a layer of more than one material and may be either uniformly flat or contain regions with varying thicknesses.

As defined herein, "elastomeric" corresponds to any material that is able to resume its original shape when a deforming force is removed. Elastomers are polymeric and have a low Young's modulus and a high yield point. At room temperature, elastomers tend to be soft and flexible.

The present application improves on the prior art in several ways: (1) by eliminating the required use of a delicate spring contact finger, (2) by providing a simple method for mounting and exchanging specimen support devices and making electrical contacts to specimen support devices without the need for partially disassembling the specimen tip (e.g., removing screws or other small parts); and (3) by increasing the number of electrical contacts available thus increasing the number of experiments that can be performed on the specimen support device.

Figure 2:
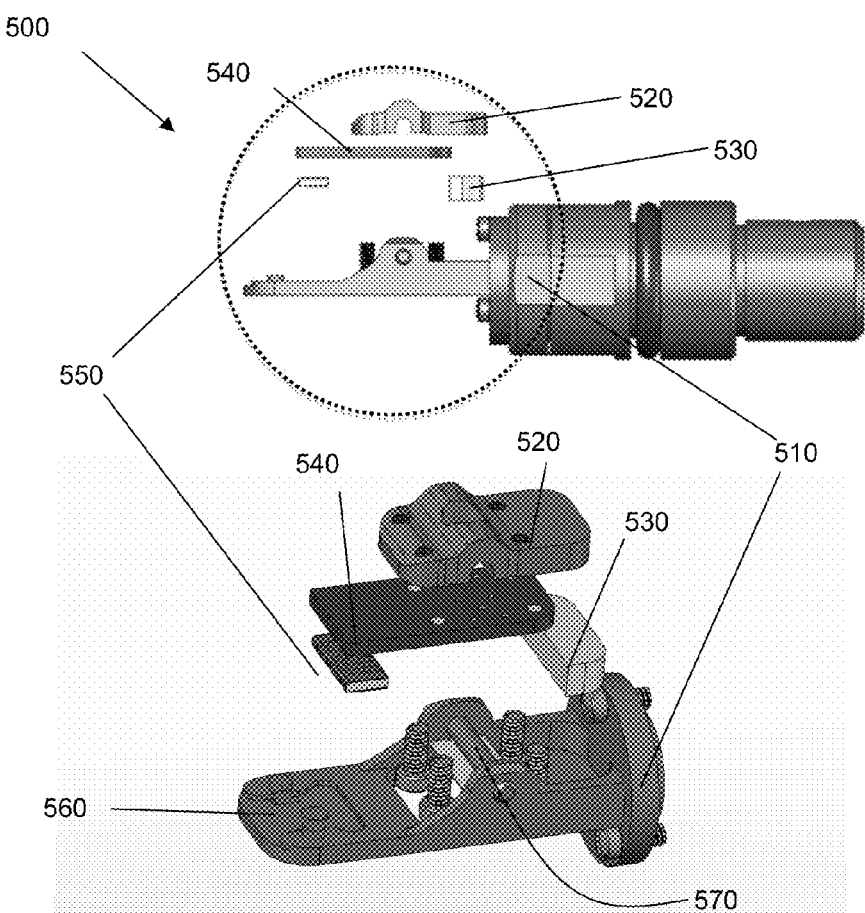
FIG. 2 shows a schematic of an exploded view of the various components of the tip of the specimen holder.
Figure 3:
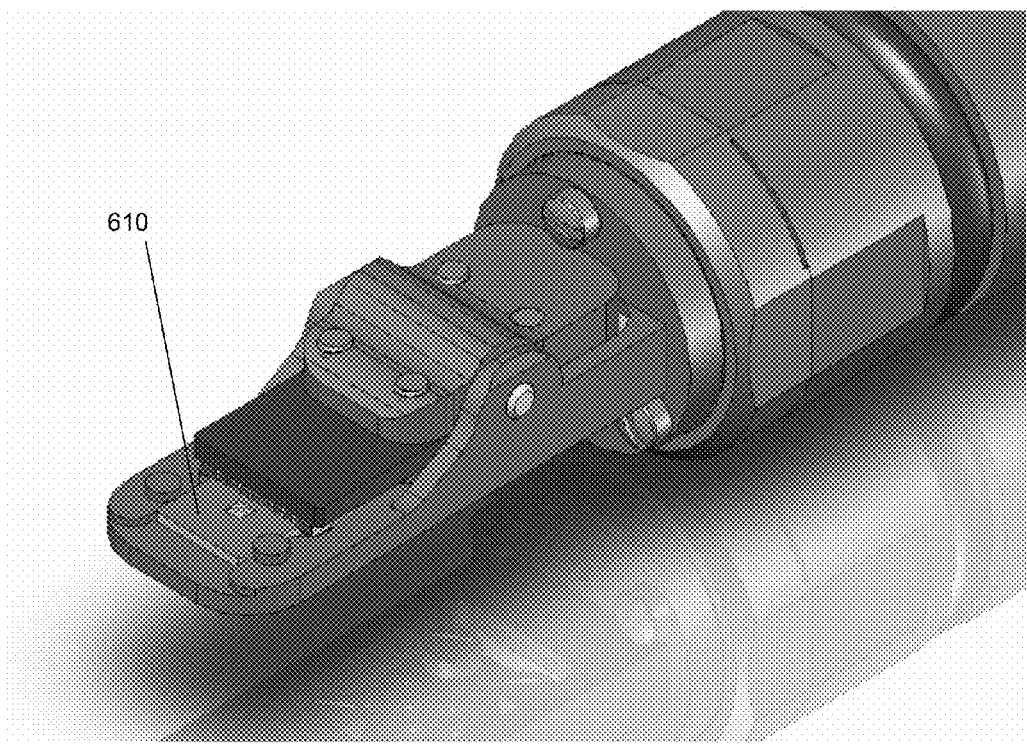
FIG. 3 shows a schematic of an exploded view of the tip of the specimen holder.

An exploded view of the various components of the specimen holder is shown in FIG. 2 and a detailed view of the specimen holder apparatus described herein is shown in FIG. 3. The components of the specimen holder apparatus (500) include, but are not limited to, a tip body (510), an elastomeric pad (550), a printed circuit board (540), a rocker (520) and a spring pad (530).

For the purposes of the present description, a tip body (510) is a machined piece of metal that attaches to one end of the specimen holder barrel (200). All other components listed below are attached to the tip body. The end of the specimen holder (500) not attached to the barrel (200) contains a groove (560) and the specimen support device (see, (610) in FIG. 3) is inserted into this groove. The groove preferably includes guide walls or screws and a back stop.

For the purposes of the present description, an elastomeric pad (550) consists of a small rectangular piece of vacuum-compatible elastomeric material, such as PORON® microcellular urethane foams (Rogers Corporation, Rogers, Conn.). An array of very small wires, spaced very tightly, is wrapped around the PORON material such that an unbroken electrical path is achieved from the top of the pad to the bottom of the pad. Metal traces on the printed circuit board (PCB) (540) electrically contact the top of the elastomeric pad (550), while the bottom of the elastomeric pad electrically contacts the specimen support device (see (610) in FIG. 3). As such, an unbroken electrical path is formed from the metal traces on the PCB to the specimen support device. The elastomeric material is somewhat soft and can slightly deform, which allows for low force contact to the specimen support device that can accommodate any variety of electrical contact shapes and sizes. It should be appreciated that the elastomeric material is not limited to PORON, as readily determined by the skilled artisan.

For the purposes of the present description, the underside of the printed circuit board (PCB) (540) contains a row of narrow, tightly spaced metal traces positioned over the elastomeric pad. These traces are routed out to a series of holes in the PCB, which provide contact points for the wires that run from the PCB to the electrical connector on the knob of the holder. The PCB is rigid and is physically connected to the rocker, so the PCB can be raised and lowered by moving the rocker.

For the purposes of the present description, the rocker (520) connects the PCB (540) and the elastomeric pad (550) to the tip body at a pin joint pivot (570). The rocker is used to raise the PCB and elastomeric pad when loading a specimen support device, and to lower the PCB and elastomeric pad when contacting a specimen support device. The top of the PCB (540) is attached to the bottom of the rocker (520), such that the elastomeric contact on the PCB extends beyond one side of the rocker. A soft PORON spring pad (530) supports the other side of the rocker (520). When the side of the rocker over the PORON pad is pushed downward, the elastomeric pad on the opposite side raises, and a specimen support device can be loaded into the groove (560). When the side of the rocker over the soft PORON pad is released, the PORON pushes the rocker upward and the elastomeric pad on the opposite side is pushed down onto the specimen support device, forming an electrical contact. It should be appreciated that other connecting means may be used to connect the rocker to the tip body other than the pin joint pivot, as readily determined by the skilled artisan.

Accordingly, rather than using spring contact fingers (bent slightly at their tips) to separately promote contact with each pad on the specimen support device, the specimen holder described herein includes at least metal traces on the elastomeric pad, which bridge to corresponding metal traces on the PCB and the specimen support device. When the specimen support device is secured into the groove (560), the rocker provides mechanical force for securing the specimen support device in place for imaging as well as simultaneously pressing the metal traces of the elastomeric pad against corresponding metal traces on the specimen support device.

Using the specimen holder described herein, a specimen support device can be mounted quickly and easily, making both physical and electrical contacts, without the need to partially disassemble the specimen tip to mount the specimen support device.

To mount the specimen support device, downward pressure is placed on the spring pad (530) end of the rocker (520), which lifts the opposite end above the surface to a level at least as high as the thickness of the specimen support device, and typically higher, for example, greater than 1 mm, although less than 1 mm is contemplated. The specimen support device is either placed in between the clip and the mounting surface manually, or slid underneath the clip along the mounting surface using the guide screws and depth stop as guidance. Once the specimen support device is in position, the rocker is released and the specimen support device is secured manually to the specimen tip.

Electrical contacts from the holder to the specimen support device, typically in a range from 1 to 50 electrical contacts, are provided by the traces on the elastomeric pad. These electrical contacts are electrically isolated from each other. When electrical pads exist on the specimen support device, the guide mechanism and depth stop will align the specimen support device with the clip to allow the electrical contacts from the clip and the pads from the specimen support device to contact one another when downward pressure on the clip is released. This will allow both mechanical pressure and electrical connections to be made in a novel, easy to operate design. The electrical contacts will extend from the sample holder tip to the barrel, down the barrel to the end, and to a connector that exists at the specimen holder end that can be mated with a plug outside the microscope and connected to a power supply to provide voltage or current through the holder and interface to the specimen support device. Each conductor will remain isolated from each other as well as the three components of the specimen holder.

The advantages of the specimen holder described herein include, but are not limited to: the ready adaptation of the specimen holder to accommodate specimen support devices having varying shapes and sizes without the need to machine frames and custom parts to align different specimen support device geometries; providing a simple method for mounting and exchanging specimen support devices and making electrical contacts to specimen support devices without the need for partially disassembling the specimen tip; allowing for interchangeable specimen tips to accommodate different specimen supports or to be used with different barrels and ends; and eliminating the use of a delicate spring contact finger.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An electron microscope specimen holder comprising a tip body, a soft pad, and a rocker, wherein the rocker comprises a first end and a second end and is secured to the tip body at a pivot point positioned between the first end and the second end of the rocker, and wherein the soft pad is positioned between the tip body and the first end of the rocker such that the first end of the rocker can be depressed to pivotally raise the second end of the rocker or the first end of the rocker is not depressed and the soft pad pushes the first end of the rocker upward such that the second end can secure a specimen support device between the tip body and the second end of the rocker clipping means.

2. The specimen holder of claim 1, wherein a top surface of a printed circuit board is attached to a bottom surface of the second end of the rocker.

3. The specimen holder of claim 2, wherein a top surface of an elastomeric pad is physically and electrically attached to a bottom surface of the printed circuit board.

4. The specimen holder of claim 3, wherein a specimen support device is secured between a bottom surface of the elastomeric pad and a top surface of the tip body.

5. The specimen holder of claim 3, wherein a specimen support device is secured such that at least one electrical lead of the specimen support device substantially contacts at least one electrical contact of the elastomeric pad.

6. The specimen holder of claim 5, wherein an unbroken electrical path is formed from the printed circuit board to the specimen support device.

7. The specimen holder of claim 3, wherein the elastomeric pad comprises an elastomeric material and an array of wires.

8. The specimen holder of claim 1, wherein the specimen holder is inserted into an electron microscope.

9. The specimen holder of claim 1, further comprising a specimen support device mechanically secured between the rocker and the tip body.

10. The specimen holder of claim 9, wherein the specimen support device comprises a frame, at least one electrical lead and at least one membrane region.

11. The specimen holder of claim 9, wherein the specimen support device is aligned using a groove.

12. The specimen holder of claim 1, wherein the tip body includes a viewing region.

13. A method of using a specimen holder in electron microscopy, said method comprising:
  positioning a specimen support device in the specimen holder of claim 1; and
  inserting said specimen holder in an electron microscope.

14. A method of providing an electrical contact between a specimen and a specimen holder of an electron microscope, said method comprising:
  positioning a specimen on a specimen support device, wherein the specimen support device comprises a frame, at least one electrical lead and at least one membrane region; and
  inserting the specimen support device in the specimen holder, wherein the specimen holder comprises a tip body, a soft pad, and a rocker, wherein the rocker comprises a first end and a second end and is secured to the tip body at a pivot point positioned between the first end and the second end of the rocker, wherein the soft pad is positioned between the tip body and the first end of the rocker, wherein the rocker comprises at least one electrical contact integrated on and/or in a bottom surface of the rocker; and wherein at least one electrical lead of the device substantially contacts at least one electrical contact of the rocker.

15. The method of claim 14, wherein the soft pad is positioned such that the first end of the rocker can be depressed to pivotally raise the second end of the rocker or the first end of the rocker is not depressed and the soft pad pushes the first end of the rocker upward such that the second end can secure a specimen support device between the tip body and the second end of the rocker.

16. The method of claim 13, wherein a specimen is on the specimen support device and an electron beam is controlled to form an image of the specimen.

\* \* \* \* \*

UNITED STATES PATENT AND TRADEMARK OFFICE
CERTIFICATE OF CORRECTION

| | | |
|---|---|---|
| PATENT NO. | : 8,872,128 B2 | Page 1 of 1 |
| APPLICATION NO. | : 13/920419 | |
| DATED | : October 28, 2014 | |
| INVENTOR(S) | : Damiano, Jr. et al. | |

It is certified that error appears in the above-identified patent and that said Letters Patent is hereby corrected as shown below:

In the Claims,

Column 6, Line 8: change "second end of the rocker clipping means." to --second end of the rocker.--

Signed and Sealed this
Seventeenth Day of March, 2015

Michelle K. Lee
*Director of the United States Patent and Trademark Office*